United States Patent
Chen

(12) 
(10) Patent No.: US 6,303,459 B1
(45) Date of Patent: Oct. 16, 2001

(54) INTEGRATION PROCESS FOR AL PAD

(75) Inventor: Sheng-Hsiung Chen, Taichung (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/439,359

(22) Filed: Nov. 15, 1999

(51) Int. Cl.[7] ...................................... H01L 21/76
(52) U.S. Cl. ................ 438/401; 438/653; 438/688; 438/785; 438/975
(58) Field of Search ................... 438/401, 462, 438/688, 720, 785, 945, 975, 612, 653, 656

(56) References Cited

U.S. PATENT DOCUMENTS

| | | | |
|---|---|---|---|
| 4,632,724 | * 12/1986 | Chesebro et al. | 438/401 |
| 5,384,284 | 1/1995 | Doan et al. | 438/610 |
| 5,401,691 | 3/1995 | Caldwell | 438/692 |
| 5,731,243 | 3/1998 | Peng et al. | 438/612 |
| 5,869,383 | 2/1999 | Chien et al. | 438/401 |
| 6,153,492 | * 11/2000 | Wege et al. | 438/401 |
| 6,180,503 | * 1/2000 | Tzeng et al. | 438/601 |

FOREIGN PATENT DOCUMENTS 6-84897-A  *  3/1994 (JP) ................... H01L/21/3205

* cited by examiner

Primary Examiner—T. N. Quach
(74) Attorney, Agent, or Firm—George O. Saile; Stephen B. Ackerman

(57) ABSTRACT

A new method is provided for creating an aluminum pad on the surface of a semiconductor substrate. A passivation layer is deposited over the surface of the substrate; a layer of TaN is deposited over the passivation layer. A masked layer of aluminum is next deposited; this layer of aluminum is patterned such that the surface of the barrier layer that aligns with the alignment marker remains free of aluminum. Under the first embodiment of the invention, the exposed surface of the layer of TaN is etched to reduce the thickness of the layer of TaN to the point where the alignment marker is visible. Under the second embodiment of the invention, the exposed surface of the layer of TaN is oxidized to form a layer of $Ta_2O_5$ over this surface; this layer of $Ta_2O_5$ is transparent making the alignment marker visible. For both embodiments of the invention the surface area of the deposited aluminum can be roughened in order to enhance connect reliability for applications where the aluminum pad is used for metal interconnects.

21 Claims, 1 Drawing Sheet

INTEGRATION PROCESS FOR AL PAD

BACKGROUND OF THE INVENTION

1. Field of the Invention

The invention relates to the fabrication of integrated circuit devices, and more particularly, to a method of forming TaN/Al over the alignment mark of a wafer.

2. Description of the Prior Art

The most important trend in the semiconductor industry over the last several decades has been a continued striving to improve device performance, which requires a continued decrease of semiconductor device feature sizes. In present day semiconductor devices, it is not uncommon to encounter feature size in the deep sub-micron range. With this decrease in feature size, sub-micron metal interconnects become increasingly more important. A number of different approaches are used in the art for the formation of patterns of interconnect lines, most of these approaches start with the deposition of a patterned layer of dielectric where the pattern in the dielectric forms contact openings between overlying metal and underlying points of electrical contact. A layer of metal is deposited over the layer of dielectric and patterned in accordance with the required pattern of interconnect lines whereby the interconnect lines, where required, align with the underlying contact openings. The patterning of the layer of metal requires the deposition of a layer of photoresist over the layer of metal, the photoresist is exposed typically using photolithographic techniques and etched, typically using a dry etch process. However, dry etches tend to be resisted by copper. Also, dry etches are expensive due to the high Capitol cost Reaction Ion Etch (RIE) systems and are limited in application because they require a hard mask such as nickel, aluminum or gold. The patterned layer of photoresist is removed after the interconnect metal line pattern has been created leaving the interconnect line pattern in place. For sub-micron metal line sizes, these highlighted processing steps encounter a number of problems that are typical of device sub-miniaturization. These problems are problems of poor step coverage of the deposited metal (the metal should be evenly deposited and should fill the profile for the metal line with equal metal density), problems of etching (using dry etching but metal such as copper and gold are difficult to plasma etch) and problems of step coverage and planarization for the overlying layer of dielectric. Aluminum has typically been used for interconnect metal lines but aluminum presents problems in the sub-micron environment that have stimulated the search for replacement metals for interconnect lines such as copper. While aluminum can be plasma etched, the molecular structure of aluminum is readily disturbed during subsequent device processing steps of the semiconductor substrate whereby the aluminum of the metal line forms hillocks (on its surface) or other surface irregularities that, especially in the sub-micron device feature environment, make aluminum a less desirable material to use for establishing metal interconnect lines. While many different materials (for instance aluminum, copper, gold, silver, polysilicon and tungsten) lend themselves for interconnect materials, copper has recently received considerable attention as a material that offers advantages for interconnect lines. Copper and aluminum copper alloys have been widely explored as fine line interconnects in semiconductor manufacturing. Typical examples of fine line interconnect metals include $Al_xCu_y$, where the sum of x and y is equal to one and both x and y are greater than or equal to zero and less than or equal to one, ternary alloys such as Al—Pd—Cu and Al—Pd—Nb, and other similar low resistivity metal-based alloys. However, the continued emphasis on scaling down line width dimensions in sub-micron circuitry design has led to problems of reliability such as problems of inadequate isolation, electromigration, planarization, formation of undesirable inter metallic alloys and/or recombination centers in other parts of the integrated circuit and low diffusion rates. Copper has the additional disadvantage of being readily oxidized at relatively low temperatures. Nevertheless, copper is seen as an attractive replacement for aluminum because of its low cost and ease of processing so that the prior and current art has tended to concentrate on finding ways to overcome these limitations. A particular problem related to copper's high susceptibility to oxidation is that conventional photoresist processing cannot be used when the copper is to be patterned into various wire shapes because the photoresist needs to be removed at the end of the process by heating it in a highly oxidized environment, such as an oxygen plasma, thereby converting it to an easily removed ash. These problems have been approached in the art by coating deposited copper with relatively thick layer of Inter Metal Dielectric (IMD) or by depositing the layers of copper in a manner that counter-acts the creation of some the indicated problems. In the latter category for instance falls the method of low temperature RF sputtering deposition of the copper.

While copper offers low resistivity, high electromigration resistance and stress voiding resistance, it also suffers from high diffusivity in common insulating materials such as silicon oxide and oxygen-containing polymers. It is known that, for instance, copper diffuses into polyimide during high temperature processing of the polyimide. The diffused copper combines with the oxygen that is present in the polyimide causing severe corrosion of the copper and the polyimide. The corrosion may lead to loss of adhesion, delamination, voids, and ultimately a catastrophic failure of the component. The diffusion of the copper into the dielectric may also cause the dielectric to become conductive and to decrease the dielectric strength of the dielectric layer. A copper diffusion barrier is therefore often required. Silicon nitride is a diffusion barrier to copper, but the prior art teaches that the interconnects should not lie on a silicon nitride layer because it has a high dielectric constant compared with silicon dioxide. The high dielectric constant causes an undesirable increase in capacitance between the interconnect and the substrate.

During the formation of the interconnect pattern and other patterns in the semiconductor substrate, it is critical that the subsequent layers that are created are in perfect alignment with respect to each other. The wafer stepper that is typically used to perform the alignment from one layer to the next must therefore have a high wafer alignment precision. The wafer stepper transfers a desired pattern that is contained in a reticle into a layer that is formed on the semiconductor wafer. To align the wafer, onto which a new layer must be created, the wafer is typically coated with a layer of photoresist. An alignment mark is provided on the wafer, the wafer is loaded into the wafer stepper tool. The wafer stepper tool uses the alignment mark on the wafer as a point of reference. With this reference point, the position of the reticle is adjusted over the wafer such that the reticle is precisely aligned with the previous layer on the wafer. A laser beam is typically used by the wafer stepper to sense the position of the alignment mark on the wafer.

The process of forming alignment markers on the surface of a substrate that uses copper wiring for the interconnect lines poses a particular challenge. The conventional approach is to create an aluminum pad and place a conductive epoxy over the pad. However, when the aluminum pad is exposed to air, the aluminum reacts with the oxygen and forms $Al_2O_3$ forming an insulating layer over the deposited layer of conductive epoxy. This insulating layer can form a very high resistance in interconnecting the pad, which is undesirable for the overall device performance. As already has been pointed out, copper is increasingly considered as a metal interconnect material in view of the improved performance that is provided by copper. Copper however typically readily oxidizes when exposed to open air under room temperature. For this reason, where copper is exposed to the open air, an aluminum pad is provided that shields the underlying copper from oxidation. As a barrier layer that is first deposited over the underlying copper TaN has been accepted as the material of choice for this function.

During the fabrication of semiconductor devices, multiple layers of conductors and insulators are deposited on each other and are patterned for each particular application. It is thereby critical that these depositions to align with respect to each other in order to maintain the required device configuration. This function of providing alignment between successive depositions is the function of the wafer stepping tool. A pattern that needs to be created in a surface is contained, in magnified form, in a reticle. One or more alignment marks are provided in the surface of the wafer, the alignment marks are typically located near the center of a stepping field, these stepping field, serve only the purpose of containing the alignment mark and are skipped during wafer alignment and exposure. In forming an alignment mark, it must be remembered that the alignment mark is contained in the surface of a substrate whereby the vast majority of this surface is used for the creation of active semiconductor devices. Etching generally forms an alignment mark into practical for semiconductor processing operations. Every effort must therefor be applied to assure that the alignment marker remains visible and available for aligning wafers. surface of the substrate to a known depth creating a step height in the surface of the substrate. The process of wafer alignment uses laser technology whereby the laser with a fixed wavelength is used to sense the position of the alignment mark on the surface of the substrate. To achieve good resolution and to minimize the impact of the signal to noise ratio of the laser detraction in positioning the wafer, the step height of the alignment mark is typically selected as being ¼ of the wavelength of the laser that is used to perform the wafer alignment. After the alignment mark has been etched into the surface of the substrate, the process of forming additional layers on this surface continues. This process may be the deposition of layers of dielectric, the formation of interconnect metal or polysilicon conductors or the formation of active devices such as gate electrodes. It is thereby clearly important that the step height of the alignment mark does not "disappear" under the deposited layers or gets eliminated during processes of global planarization of the surface of the substrate. The apparent solution to this might be to increase the step height of the alignment marker, this however leads to problems of interrupts in layers of interconnect metal while this approach does nothing to alleviate the problems that are caused by global planarization. Particular problems arise where opaque layers such as layers of metal are deposited since these depositions make the alignment marker invisible and therefore in effect unavailable for purposes of wafer alignment. As has been stated, the blank stepping fields that contain the alignment marker are skipped during device processing steps so that all layers that are deposited over the surface of the substrate, while being etched or otherwise processed over active devices, will accumulate over the surface of the stepping field and will form a significantly raised surface area. The raised surface area is referred to as the "mesa effect", the high plateau overlying the stepping fields have a significantly negative impact on the regions that are immediately adjacent to the stepping fields when polishing and planarization are performed. An apparent solution to the mesa effect would be to remove layers from above the stepping field as separate steps of etching. This however has the disadvantage that, where addition steps of deposition of for instance a dielectric layer are performed after the etch of the stepping field has been completed, an excessive amount of the deposited dielectric will accumulate over and within the opening that has been created over the stepping field, in effect negating the objective of keeping the alignment marker visible and requiring yet another processing step of removing the accumulated dielectric. This approach is therefore not practical for semiconductor processing operations. Every effort must therefor be applied to assure that the alignment marker remains visible and available for aligning wafers.

The invention teaches a method of forming an aluminum pad in an environment of copper interconnect lines that can be readily integrated into the regular processing stream. The process further provides rough aluminum pad surface and can be applied to wafer sizes in excess of 8". The typical Wide Clear Window (WCW) mask layer step is further eliminated by the process of the invention. The process of forming the aluminum pad is aimed at creating alignment pads but can possibly be extended to bond pads or any other large surface area on the surface of a semiconductor substrate.

U.S. Pat. No. 5,869,383 (Chein et. al.) teaches a method for forming a pad and a fuse. However, this reference differs from the invention.

U.S. Pat. No. 5,401,691 (Caldwell shows an open frame alignment mark process.

U.S. Pat. No. 5,731,243 (Peng et al.) teaches a process to clean a residue from an Al pad.

U.S. Pat. No. 5,384,284 (Doan et al.) teaches a process to form a pad.

SUMMARY OF THE INVENTION

A principle objective of the invention is to provide an aluminum pad for a semiconductor substrate that essentially contains copper interconnect metal lines.

Another objective of the invention is to reduce the number of processing steps that are required to create an aluminum pad.

Yet another objective of the invention is to provide a method for creating an aluminum pad that can be readily integrated into a regular production sequence.

A still further objective of the invention is to provide a contact pad that has a rough surface thereby improving wire-bonding characteristics of the pad.

In accordance with the objectives of the invention a new method is provided for creating an aluminum pad on the surface of a semiconductor substrate, specifically over the surface of the substrate that contains an alignment marker. A passivation layer that may contain an Inter Metal dielectric is deposited over the surface of the substrate; a barrier layer of TaN is deposited over the passivation layer. A layer of aluminum is deposited over the layer of TaN whereby a mask is used such that the aluminum is deposited over the barrier layer with aluminum depositions over the surface of the barrier layer that are adjacent to the alignment marker while no aluminum is deposited on the surface of the barrier layer that is above the alignment marker. Under the first embodiment of the invention, the layer of TaN that is exposed is etched to reduce the thickness of the layer of TaN to the point where the alignment marker is visible. Under the second embodiment of the invention, the exposed surface of the layer of TaN is oxidized to form a layer of $Ta_2O_5$ over this surface.

DESCRIPTION OF THE PREFERRED EMBODIMENTS

The process of the invention specifically aims at but is not limited to future product developments where barrier layers will become thicker. Copper will in the future be increasingly used due to its attractive performance characteristics, most notably its low resistance. Copper however readily oxidizes which may result in aluminum pads being used for the copper interconnect metal environment. For this environment, TaN is typically used for barrier layer material. Where the layer of TaN overlays an alignment marker, this does not present a problem of alignment marker visibility as long as the TaN barrier layer is not thicker that about 200 Angstrom. It is however expected that this thickness will increase to as much as 600 or even 1000 Angstrom in which case the alignment marker will no longer be visible through the barrier layer. The invention teaches a method where, for thick layers of TaN that overlay an alignment marker, the alignment marker can be made visible by using aluminum for the surface of a pad that surrounds the alignment marker. This concept can readily be extended to where the aluminum pad is used with copper interconnect wiring and the therewith associated formation of bond pads. The surface of the aluminum pad of the invention is, as part of the invention, roughened, which provides better adhesion and bonding performance of a bond pad.

It must be emphasized that the substrate cross sections that are shown in FIGS. 1 through 4 are cross section of substrate surface regions from which metal layers have been removed using conventional methods of CMP or etch. These regions are the regions in the surface of the substrate wherein the alignment marker 20 is contained.

Figure 1:
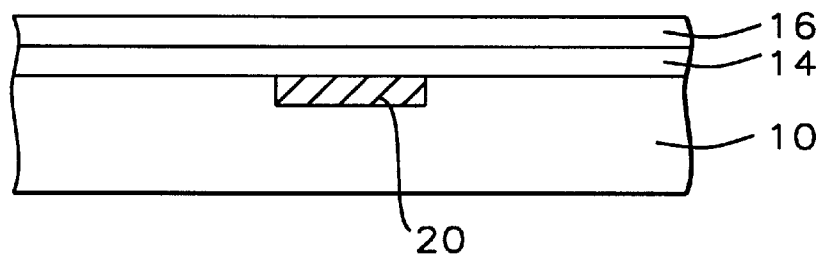
FIG. 1 shows a cross section of a silicon substrate after the deposition of a layer of passivation over which a barrier layer is deposited.

Referring now specifically to FIG. 1, there is shown a cross section of a silicon substrate 10, a passivation layer 14 is deposited over the surface of the substrate 10 thereby including the surface of the alignment marker 20. The passivation layer 14 takes the place of the Inter Metal Dielectric layer of conventional structures. Passivation 14 layer can contain silicon oxide/silicon nitride ($SiO_2/Si_3N_4$) deposited by CVD, passivation layer can also be a photosensitive polyimide. A typical passivation layer is deposited to a thickness between about 4000 and 12000 Angstrom. The preferred passivation layer of the invention contains $SiO_x$ or $Si_xN_y$ that is deposited to the indicated thickness.

A typical diffusion barrier layer 16 may contain silicon nitride, phosphosilicate glass (PSG), silicon oxynitride, aluminum, aluminum oxide (AlxOy), tantalum, titanium nitride, nionbium, or molybdenum. A barrier layer is typically deposited using rf. sputtering, to a thickness between about 500 to 1000 Angstrom.

The preferred barrier layer 16 of the invention contains tantalum nitride (TaN) and is deposited over the surface of the passivation layer 14 to a thickness of about 600 Angstrom.

Alignment marker 20, FIG. 1, can also be the functional equivalent of a copper bond pad over which an aluminum pad will be formed. The alignment marker 20 also serves the role of being a point of reference (marker) during subsequent steps of etching.

Figure 2:
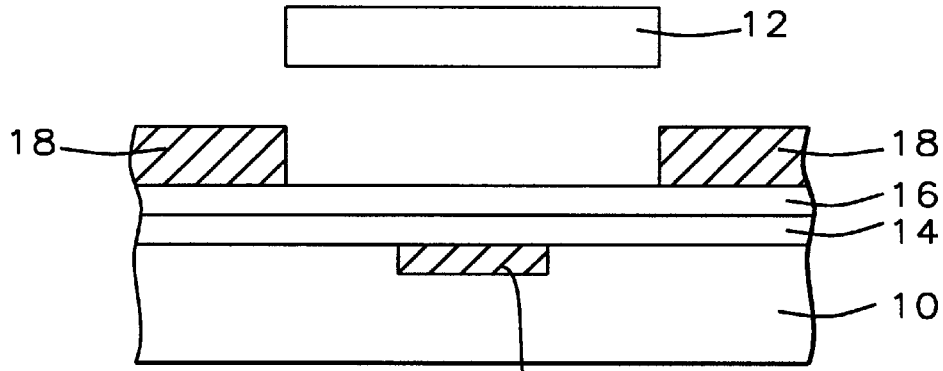
FIG. 2 shows a cross section of the substrate after the layer of aluminum has been deposited using a pad mask.

FIG. 2 shows a cross section after a layer 18 of aluminum has been deposited on the surface of the barrier layer 16. Alignment marker mask 12 is used to intercept the deposition of aluminum where this aluminum would overlay the surface area of the barrier layer 16 that is above the alignment marker 20. It is therefore clear from the cross section that is shown in FIG. 2 that aluminum is deposited in surface areas of the barrier layer 16 that are adjacent to the alignment marker 12 but that do not overlay the alignment marker 12 leaving the surface above the alignment marker 12 exposed. The layer 18 of aluminum has been blanket deposited using rf sputtering and is typically deposited to a thickness of between about 3000 and 6000 Angstrom.

Figure 3:
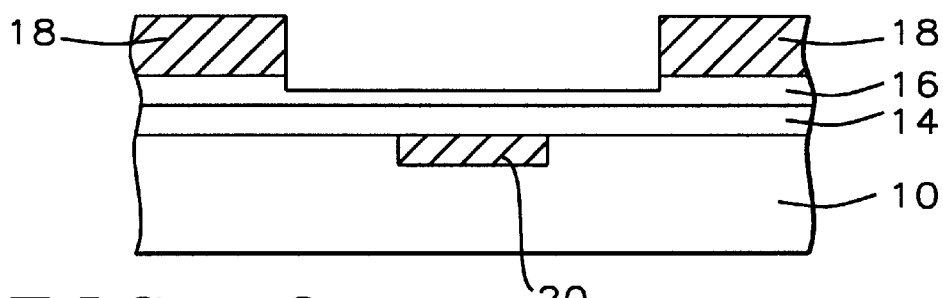
FIG. 3 shows a cross section of the substrate after the surface of the barrier layer has been etched.

FIG. 3 shows a cross section of substrate surface after the exposed barrier layer has been etched. Layer 16 of TaN can be etched using carbon tetrofluoride ($CF_4$) or $CHF_3$ or $SF_6$—$O_2$ as an etchant gas using a commercially available parallel plate anisotropic RIE etcher or an Electron Cyclotron Resonance (ECR) plasma reactor. Other types of etching apparatus, such as other high-density plasma source types of apparatus, can be used. For example, etching can also be conducted with an Electron Cyclotron Resonance (ECR) type apparatus or a Helicon Resonant Inductive coupled plasma source type apparatus. The etch that is applied to layer 16 is an end-point stop on silicon oxide of the underlying passivation layer 14. The etch that has been applied as shown in FIG. 3 results in reduced thickness of layer 16 in a region of layer 16 that aligns with the alignment marker 20. It is therefore clear that this etch results in reducing the barrier layer 16 above the alignment marker thereby making the alignment marker 20 visible for further use.

Figure 4:
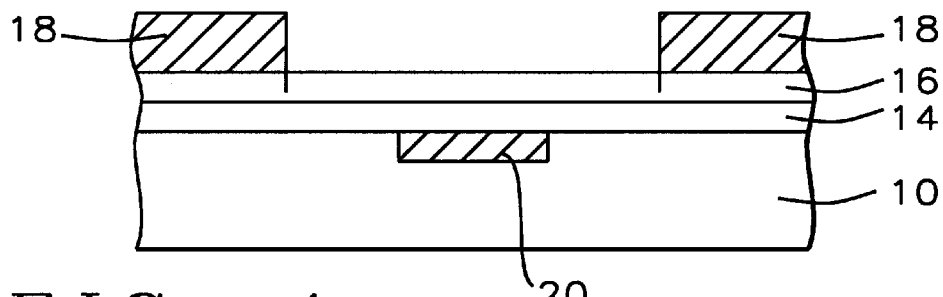
FIG. 4 shows a cross section of the substrate after the surface of the barrier layer has been oxidized.

FIG. 4 shows a cross section of the substrate surface after the exposed surface of barrier layer 16 has been oxidized thereby converting that layer of TaN to $TaO_5+NO_2$, this in accordance with the equivalence of $TaN+O_2 \rightarrow TaO_5+NO_2$. The hereby created $TaO_5$ is transparent with the result that the alignment marker 20 is visible for further use.

The cross section of the aluminum pad in a plane that is parallel to the surface of the substrate typically forms a square; the sides of this square are typically about 1.0 to 1.5 um long. A typical bond pad has a thickness of between 4000 and 8000 Angstrom, this thickness under the invention is the height of the column 18 of aluminum that is created on the surface of the barrier layer 16.

The etching of layer 16 as indicated has the additional advantage of increasing the surface roughness of the surface of the aluminum pad 18 which improves the pad wire bonding characteristics.

The oxidation of layer 16 of TaN can be performed in an oxidation chamber at a temperature between about 950 and 1150 degrees C. for a time between about 50 and 70 seconds and at a pressure below about $10^{-6}$ Torr by exposing the surface of layer 16 substrate to an oxidizing atmosphere containing $O_2$, $O_3$, $H_2O_2$, $SO_2$, $SO_3$, $H_2O$, HCl, $N_2O$, NO or mixtures thereof.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming an aluminum pad on the surface of a semiconductor substrate said aluminum pad overlying and essentially being aligned with an alignment marker in the surface of said substrate, comprising the steps of:

providing a semiconductor substrate said substrate having been provided with one or more alignment markers in its surface;

depositing a passivation layer over the surface of said substrate thereby including the surface of said alignment markers;

depositing a barrier layer over the surface of said passivation layer;

depositing a masked layer of aluminum over said barrier layer thereby leaving portions of said barrier layer exposed; and performing an etch of said exposed surface of said barrier layer.

2. The method of claim 1 wherein said depositing a passivation layer over the surface of said substrate is depositing a layer of material that contains one or more of the elements selected from the group comprising silicon oxide/silicon nitride ($SiO_2/Si_3N_4$) and photo-sensitive polyimide deposited by CVD to a thickness between about 4000 and 12000 Angstrom.

3. The method of claim 1 wherein said depositing a barrier layer over the surface of said passivation layer is depositing a layer of TaN to a thickness between about 400 and 800 angstrom deposited by CVD.

4. The method of claim 1 wherein said depositing a masked layer of aluminum over said passivation layer is depositing said aluminum in a pattern that does not overlay that surface region of said barrier layer that overlays and aligns with said alignment marker whereby aluminum is deposited in areas that are adjacent to the surface region of said barrier layer that overlays and aligns with said alignment marker.

5. The method of claim 1 wherein said depositing a masked layer of aluminum uses rf sputtering whereby said layer of aluminum is deposited to a thickness of between about 3000 and 6000 Angstrom.

6. The method of claim 1 wherein said etching said barrier layer is a dry etch using carbon tetrofluoride ($CF_4$) or $CHF_3$ or $SF_6$—$O_2$ as an etchant gas using a parallel plate anisotropic RIE etcher or an Electron Cyclotron Resonance (ECR) plasma reactor.

7. The method of claim 1 wherein said etching said barrier layer is a high-density plasma etch.

8. The method of claim 1 wherein said etching said barrier layer uses an Electron Cyclotron Resonance (ECR) type apparatus or a Helicon Resonant Inductive coupled plasma source apparatus.

9. The method of claim 1 wherein said performing an etch of said exposed surface of said barrier layer is reducing the thickness of said exposed barrier layer to the point where said alignment marker is visible or to where the thickness of said barrier layer that is surrounded by said cavity is about 150 Angstrom.

10. The method of claim 1 with the additional steps of providing a rough surface to said aluminum pad said additional steps to include patterning and etching the surface of said aluminum pad said additional steps to be performed after said performing an etch of said exposed surface of said barrier layer.

11. A method of forming an aluminum pad on the surface of a semiconductor substrate said aluminum pad overlying and essentially being aligned with an alignment marker in the surface of said substrate, comprising the steps of:

providing a semiconductor substrate said substrate having been provided with one or more alignment markers in its surface; depositing a passivation layer over the surface of said substrate thereby including the surface of said alignment markers by CVD to a thickness between about 4000 and 12000 Angstrom;

depositing a barrier layer of TaN over the surface of said passivation layer to a thickness between about 400 and 800 angstrom deposited by CVD;

depositing a masked layer of aluminum over said barrier layer using rf sputtering deposited to a thickness of between about 3000 and 6000 Angstrom whereby said mask layer of aluminum does not overlay the surface region of said barrier layer that overlays and aligns with said alignment marker whereby aluminum is deposited in areas that are adjacent to the surface region of said barrier layer that overlays and aligns with said alignment marker thereby leaving part of the surface of said barrier layer exposed; and performing an etch of said exposed surface of said barrier layer thereby reducing the thickness of said exposed barrier layer to the point where said alignment marker is visible or to where the thickness of said exposed barrier layer is not less than 150 Angstrom.

12. The method of claim 11 with the additional steps of providing a rough surface to said aluminum pad said additional steps to include patterning and etching the surface of said aluminum pad said additional steps to be performed after said performing an etch of said exposed surface of said barrier layer.

13. A method of forming an aluminum pad on the surface of a semiconductor substrate said aluminum pad overlying and essentially being aligned with an alignment marker in the surface of said substrate, comprising the steps of:

providing a semiconductor substrate said substrate having been provided with one or more alignment markers in its surface; depositing a passivation layer over the surface of said substrate thereby including the surface of said alignment markers;

depositing a barrier layer over the surface of said passivation layer;

depositing a masked layer of aluminum over said barrier layer thereby leaving the surface of said barrier layer that is aligned with and overlies said alignment marker exposed; and oxidizing said exposed surface of said barrier layer.

14. The method of claim 13 wherein said depositing a passivation layer over the surface of said substrate is depositing a layer of material that contains one or more of the elements selected from the group comprising silicon oxide/silicon nitride ($SiO_2/Si_3N_4$) and a photo-sensitive polyimide deposited by CVD to a thickness between about 4000 and 12000 Angstrom.

15. The method of claim 13 wherein said depositing a barrier layer over the surface of said passivation layer is depositing a layer of TaN to a thickness between about 400 and 800 angstrom deposited by CVD.

16. The method of claim 13 wherein said depositing a masked layer of aluminum over said passivation layer is depositing said aluminum in a pattern that does not overlay the surface region of said barrier layer that overlays and aligns with said alignment marker whereby aluminum is deposited in areas that are adjacent to the surface region of said barrier layer that overlays and aligns with said alignment marker.

17. The method of claim 13 wherein said depositing a masked layer of aluminum uses rf sputtering whereby said layer of aluminum is deposited to a thickness of between about 3000 and 6000 Angstrom.

18. The method of claim 13 wherein said oxidizing said barrier layer is performed in an oxidation chamber at a temperature between about 950 and 1150 degrees C. for a time between about 50 and 70 seconds and at a pressure below about $10^{-6}$ Torr by exposing the surface of said barrier layer to an oxidizing atmosphere containing one or more of the elements selected from the group containing $O_2$, $O_3$, $H_2O_2$, $SO_2$, $SO_3$, $H_2O$, HCl, $N_2O$, NO and mixtures thereof thereby forming a layer of $Ta_2O_5$ over said surface.

19. The method of claim 13 with the additional steps of providing a rough surface to said aluminum pad said additional steps to include patterning and etching the surface of said aluminum pad said additional steps to be performed after said oxidizing said exposed surface of said barrier layer.

20. A method of forming an aluminum pad on the surface of a semiconductor substrate said aluminum pad overlying and essentially being aligned with an alignment marker in the surface of said substrate, comprising the steps of:

providing a semiconductor substrate said substrate having been provided with one or more alignment markers in its surface; depositing a passivation layer over the surface of said substrate thereby including the surface of said alignment markers by CVD to a thickness between about 4000 and 12000 Angstrom;

depositing a barrier layer of TaN over the surface of said passivation layer to a thickness between about 400 and 800 angstrom deposited by CVD;

depositing a masked layer of aluminum over said barrier layer using rf sputtering deposited to a thickness of between about 3000 and 6000 Angstrom whereby said mask layer of aluminum does not overlay the surface region of said barrier layer that overlays and aligns with said alignment marker whereby aluminum is deposited in areas that are adjacent to the surface region of said barrier layer that overlays and aligns with said alignment marker thereby leaving part of the surface of said barrier layer exposed; and oxidizing said exposed surface of said barrier layer by exposing said surface of said barrier layer in an oxidation chamber at a temperature between about 950 and 1150 degrees C. for a time between about 50 and 70 seconds and at a pressure below about $10^{-6}$ Torr to an oxidizing atmosphere thereby forming a layer of $Ta_2O_5$ over said surface.

21. The method of claim 20 with the additional steps of providing a rough surface to said aluminum pad said additional steps to include patterning and etching the surface of said aluminum pad said additional steps to be performed after said oxidizing said exposed surface of said barrier layer.

* * * * *